(12) United States Patent
Kim et al.

(10) Patent No.: US 9,035,400 B2
(45) Date of Patent: May 19, 2015

(54) MICRO ELECTRO MECHANICAL SYSTEMS DEVICE

(71) Applicant: Samsung Electro-Mechanics Co., Ltd., Suwon (KR)

(72) Inventors: Jong Woon Kim, Suwon (KR); Po Chul Kim, Suwon (KR); Yu Heon Yi, Suwon (KR); Jun Lim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/030,541

(22) Filed: Sep. 18, 2013

(65) Prior Publication Data

US 2014/0084393 A1    Mar. 27, 2014

(30) Foreign Application Priority Data

Sep. 21, 2012  (KR) .................. 10-2012-0105391

(51) Int. Cl.
| | |
|---|---|
| *H01L 29/84* | (2006.01) |
| *B81B 3/00* | (2006.01) |
| *G01P 15/09* | (2006.01) |
| *G01P 15/12* | (2006.01) |
| *G01P 15/125* | (2006.01) |
| *G01C 19/5656* | (2012.01) |
| *G01P 15/08* | (2006.01) |

(52) U.S. Cl.
CPC ............... *B81B 3/0067* (2013.01); *G01P 15/09* (2013.01); *G01P 15/123* (2013.01); *G01P 15/125* (2013.01); *G01P 2015/0831* (2013.01); *G01C 19/5656* (2013.01)

(58) Field of Classification Search
CPC ........................ G01P 15/0888; G01P 15/125
USPC ........................................................ 257/415
See application file for complete search history.

(56) References Cited

U.S. PATENT DOCUMENTS

| | | | |
|---|---|---|---|
| 8,683,864 B2 * | 4/2014 | Degawa et al. ............ | 73/514.32 |
| 2009/0282918 A1 | 11/2009 | Maekawa | |
| 2013/0192364 A1 * | 8/2013 | Acar .......................... | 73/504.12 |
| 2013/0192369 A1 * | 8/2013 | Acar et al. ................. | 73/514.01 |
| 2013/0277775 A1 * | 10/2013 | Roland et al. .............. | 257/415 |

FOREIGN PATENT DOCUMENTS

JP        2010-169401          8/2010

OTHER PUBLICATIONS

Office action dated Apr. 28, 2014 from corresponding Korean Patent Application No. 10-2012-0105391 and its English summary provided by the Applicant's foreign counsel.

* cited by examiner

*Primary Examiner* — William D Coleman
(74) *Attorney, Agent, or Firm* — Ladas & Parry, LLP

(57) ABSTRACT

Disclosed herein is a micro electro mechanical systems (MEMS) device including: a mass body; a first fixed part provided at an outer side of the mass body; and a first flexible part having one end connected to a distal end of the mass body and the other end connected to the first fixed part, wherein the mass body is rotatably connected to the first flexible part.

17 Claims, 9 Drawing Sheets

MICRO ELECTRO MECHANICAL SYSTEMS DEVICE

CROSS REFERENCE TO RELATED APPLICATION

This application claims the benefit of Korean Patent Application No. 10-2012-0105391, filed on Sep. 21, 2012, entitled "Micro Electro Mechanical Systems Component", which is hereby incorporated by reference in its entirety into this application.

BACKGROUND OF THE INVENTION

1. Technical Field

The present invention relates to a micro electro mechanical systems (MEMS) device.

2. Description of the Related Art

A micro electro mechanical systems (MEMS) is a technology of manufacturing a micro mechanical structure such as a very large scale integrated circuit, a sensor, an actuator, or the like, by processing silicon, crystal, glass, or the like. MEMS devices have precision of a micrometer ($1/1,000,000$ meter) or less and may be structurally mass-produced as a micro product at a low cost by applying a semiconductor micro process technology of repeating processes such as a deposition process, an etching process, and the like.

Among the MEMS devices, a sensor has been used in various applications, for example, a military application such as an artificial satellite, a missile, an unmanned aircraft, or the like, a vehicle application such as an air bag, electronic stability control (ESC), a black box for a vehicle, or the like, a hand shaking prevention application of a camcorder, a motion sensing application of a mobile phone or a game machine, a navigation application, or the like.

The sensor generally adopts a configuration in which a mass body is adhered to an elastic substrate such as a membrane, or the like, in order to measure acceleration, angular velocity, force, or the like. Through the configuration, the sensor may calculate the acceleration by measuring inertial force applied to the mass body, calculate the angular velocity by measuring Coriolis force applied to the mass body, and calculate the force by measuring external force directly applied to the mass body.

In detail, a scheme of measuring the acceleration and the angular velocity using the sensor is as follows. First, the acceleration may be calculated by Newton's law of motion "F=ma", where "F" represents inertial force applied to the mass body, "m" represents a mass of the mass body, and "a" is acceleration to be measured. Among others, the acceleration a may be obtained by sensing the inertial force F applied to the mass body and dividing the sensed inertial force F by the mass m of the mass body that is a predetermined value. Further, the angular velocity may be obtained by Coriolis force "F=2mΩ×v", where "F" represents the Coriolis force applied to the mass body, "m" represents the mass of the mass body, "Ω" represents the angular velocity to be measured, and "v" represents the motion velocity of the mass body. Among others, since the motion velocity V of the mass body and the mass m of the mass body are values known in advance, the angular velocity Ω may be obtained by detecting the Coriolis force (F) applied to the mass body.

Meanwhile, the sensor according to the prior art includes beams extended in an X axis direction and a Y axis direction in order to drive the mass body or sense displacement of the mass body, as disclosed in the following Prior Art Document (Patent Document). However, in the sensor according to the prior art, as the displacement of the mass body increases, tension acting on the beam rapidly increases. When the tension of the beam increases as described above, rigidity of the beam also increases, such that driving displacement or sensing displacement of the mass body is limited. In addition, when the rigidity of the beam increases, a resonance frequency is changed, such that noise increases.

PRIOR ART DOCUMENT

Patent Document (Patent Document 1) US20090282918 A1

SUMMARY OF THE INVENTION

The present invention has been made in an effort to provide a micro electro mechanical systems (MEMS) device capable of preventing tension acting on a flexible part from rapidly increasing when a mass body is rotated by disposing a distal end of the flexible part connected to a fixed part to be close to a rotation axis of the mass body.

According to a preferred embodiment of the present invention, there is provided an MEMS device including: a mass body; a first fixed part provided at an outer side of the mass body; and a first flexible part having one end connected to a distal end of the mass body and the other end connected to the first fixed part, wherein the mass body is rotatably connected to the first flexible part.

The first flexible part having one end connected to a distal end of the mass body in an X axis direction and the other end connected to the first fixed part, so as to correspond to the X axis direction, the other end being closer to the Y axis as compared with one end.

The MEMS device may further include: a second fixed part provided at an outer side of the mass body; and a second flexible part having one end connected to the mass body and the other end connected to the second fixed part, so as to correspond to the Y axis.

The first flexible part may have a width in a Y axis direction larger than a thickness in a Z axis direction, and the second flexible part may have a thickness in the Z axis direction larger than a width in the X axis direction.

The MEMS device may further include a protrusion part protruded in a Y axis direction at a distal end of the mass body in the X axis direction, wherein one end of the first flexible part is connected to the protrusion part.

According to another preferred embodiment of the present invention, there is provided an MEMS device including: a mass body; a fixed part provided at an outer side of the mass body; a second flexible part having one end connected to the mass body and the other end connected to the fixed part; and a first flexible part having one end connected to a distal end of the mass body and the other end connected to the second flexible part, and wherein the mass body is rotatably connected to the second flexible part.

The second flexible part having one end connected to the mass body and the other end connected to the fixed part so as to corresponding the Y axis, and the first flexible part having one end connected to a distal end of the mass body in an X axis direction and the other end connected to the second flexible part, so as to correspond to the X axis direction, the other end being closer to the Y axis as compared with one end.

The first flexible part may have a width in a Y axis direction larger than a thickness in a Z axis direction, and the second flexible part may have a thickness in the Z axis direction larger than a width in the X axis direction.

The MEMS device may further include a protrusion part protruded in a Y axis direction at a distal end of the mass body in the X axis direction, wherein one end of the first flexible part is connected to the protrusion part.

According to still another preferred embodiment of the present invention, there is provided an MEMS device including: a mass body; an anchor provided to be surrounded by the mass body; and a first flexible part having one end connected to a distal end of the mass body and the other end connected to the anchor, wherein the mass body is rotatably connected to the first flexible part.

The first flexible part having one end connected to a distal end of the mass body in an X axis direction and the other end connected to the anchor, so as to correspond to the X axis direction, the other end being closer to the Y axis as compared with one end.

The MEMS device may further include: a fixed part provided at an outer side of the mass body; and a second flexible part having one end connected to the mass body and the other end connected to the fixed part, so as to correspond to the Y axis.

The first flexible part may have a width in a Y axis direction larger than a thickness in a Z axis direction, and the second flexible part may have a thickness in the Z axis direction larger than a width in the X axis direction.

The MEMS device may further include a second flexible part having one end connected to the mass body and the other end connected to the anchor, so as to correspond to the Y axis.

The first flexible part may have a width in a Y axis direction larger than a thickness in a Z axis direction, and the second flexible part may have a thickness in the Z axis direction larger than a width in the X axis direction.

The mass body may include a first mass body and a second mass body that are spaced apart from each other, and the anchor may be provided between the first and second mass bodies.

The MEMS device may further include a connection part formed to connect between a distal end of the first mass body in the X axis direction and a distal end of the second mass body in the X axis direction in a Y axis direction, wherein one end of the first flexible part is connected to the connection part.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
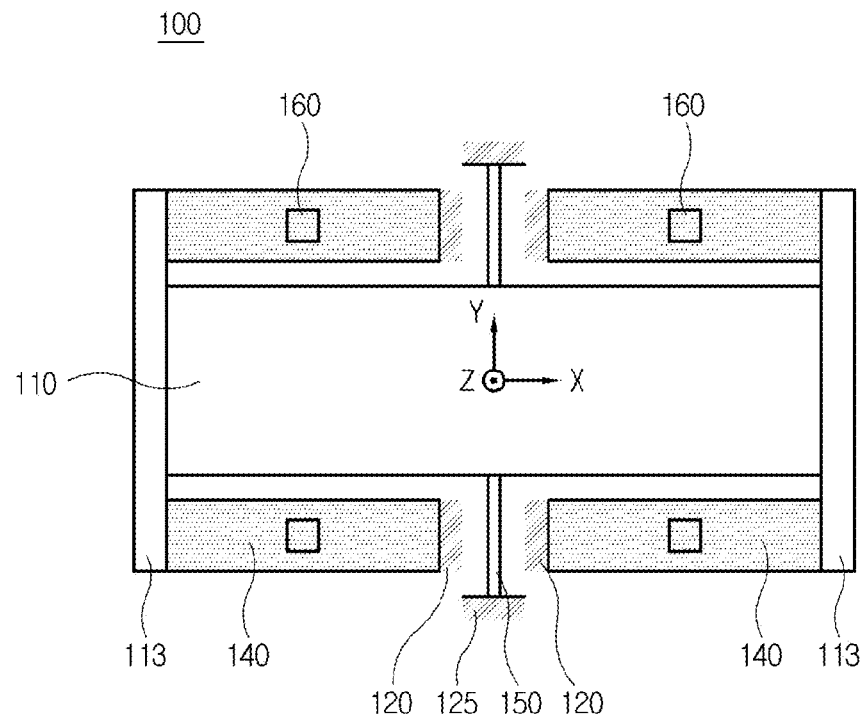
FIG. 1 is a plan view of a micro electro mechanical systems (MEMS) device according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
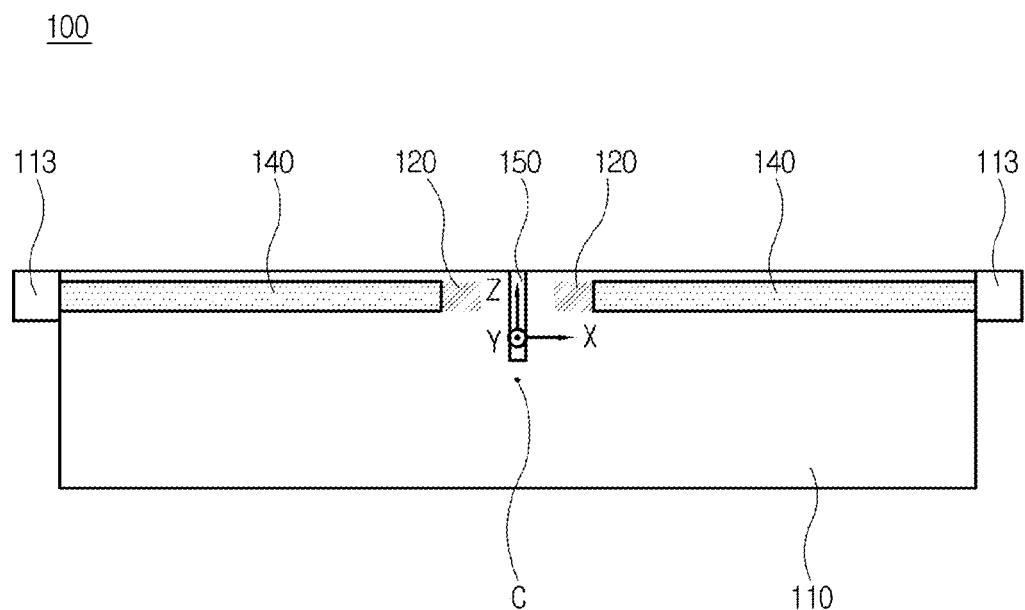
FIG. 2 is a side view of the MEMS device shown in FIG. 1.

FIG. 1 is a plan view of a micro electro mechanical systems (MEMS) device according to a first preferred embodiment of the present invention; and FIG. 2 is a side view of the MEMS device shown in FIG. 1.

As shown in FIGS. 1 and 2, the MEMS device 100 according to the present embodiment is configured to include a mass body 110 rotated based on a Y axis, a first fixed part 120 provided at an outer side of the mass body 110, and a first flexible part 140 having one end connected to a distal end of the mass body 110 in an X axis direction and the other connected fixed to the first fixed part 120, so as to correspond to the X axis direction, the other end being closer to the Y axis as compared with one end. In addition, the MEMS device 100 according to the present embodiment may further include a second fixed part 125 provided at an outer side of the mass body 110 and a second flexible part 150 having one end connected to the mass body 110 and the other end connected to the second fixed part 125, so as to correspond to the Y axis.

The mass body 110 is displaced by inertial force, Coriolis force, external force, driving force, or the like. Here, the mass body 110 may be connected to the first fixed part 120 through the first flexible part 140 and be connected to the second fixed part 125 through the second fixed part 150 as needed. Here, when force acts on the mass body 110, the mass body 110 is rotated based on the Y axis, such that it is displaced based on the first and second fixed parts 120 and 125 by bending of the first flexible part 140 and twisting of the second flexible part 150. In addition, the mass body 110 may include a protrusion part 113 protruded in the Y axis direction at a distal end thereof in the X axis direction. One end of the first flexible part 140 may be connected to the protrusion part 113. Meanwhile, although the case in which the mass body 110 has a square pillar shape is shown, the mass body 110 is not limited to having the square pillar shape, but may have all shapes known in the related art.

The first and second fixed parts 120 and 125 serve to support the first and second flexible parts 140 and 150 to allow a space in which the mass body 110 may be displaced to be secured and become a basis when the mass body 110 is displaced. Here, the first and second fixed parts 120 and 125 are not necessarily separate components, but may also be an integral component. In addition, positions of the first and second fixed parts 120 and 125 are particularly limited as long as the first and second fixed parts 120 and 125 are provided at the outer side of the mass body 110. However, since the first flexible part 140 is extended to be close to the Y axis in order to prevent tension acting on the first flexible part 140 from rapidly increasing when the mass body 110 is rotated, the first fixed part 120 to which the first flexible part 140 is connected may also be provided to be close to the Y axis. In addition, since the second flexible part 150 is formed to correspond to the Y axis so that the mass body 110 is rotated based on the Y axis, the second fixed part 125 to which the second flexible part 150 is connected may also be provided on the Y axis.

Figure 3:
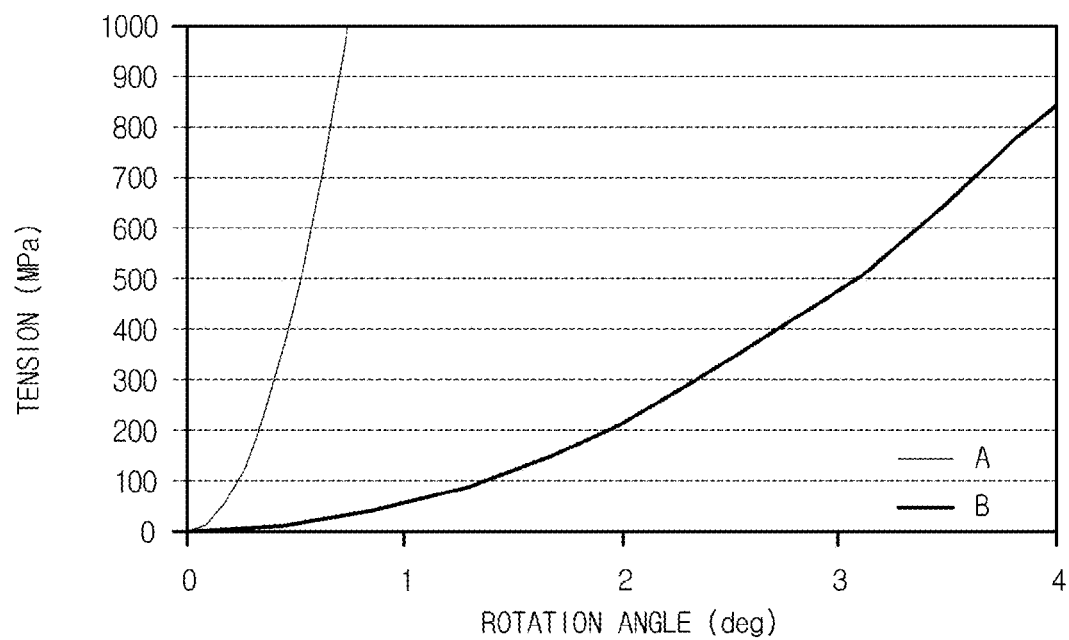
FIG. 3 is a graph showing a change in tension according to a rotation angle of a mass body shown in FIG. 1.

The first flexible part 140 serves to connect the mass body 110 and the first fixed part 120 to each other so that the mass body 110 may be displaced based on the first fixed part 120. Here, the first flexible part 140 is formed to be extended in the X axis direction and has one end connected to the distal end of the mass body 110 in the X axis direction and the other end connected to the first fixed part 120. Here, the other end of the first flexible part 140 connected to the first fixed part 120 is closer to a rotation axis (the Y axis) of the mass body 110 as compared with one end of the first flexible part 140 connected to the mass body 110. That is, a fixed portion of the first flexible part 140 (the other end of the first flexible part 140) is close to the rotation axis (the Y axis) of the mass body 110. In the case in which the fixed portion of the first flexible part 140 (the other end of the first flexible part 140) completely coincides with the rotation axis (the Y axis) of the mass body 110, even though the mass body 110 is rotated, a length of the first flexible part 140 is not changed. Therefore, in the case in which the fixed portion of the first flexible part 140 (the other end of the first flexible part 140) is formed to be close to the rotation axis (the Y axis) of the mass body 110 as in the MEMS device 100 according to the present embodiment, when the mass body 110 is rotated, the change in the length of the first flexible part 140 itself may be minimized. FIG. 3 is a graph showing a change in tension according to a rotation angle of a mass body shown in FIG. 1. Referring to FIG. 3, it could be confirmed that in the case in which the distal end of the flexible part connected to the fixed part is formed to be more distant from the rotation axis of the mass body as compared with the distal end of the flexible part connected to the mass body, the tension rapidly increases as represented by a line A according to the rotation angle of the mass body. On the other hand, in the case of the MEMS device 100 according to the present embodiment in which the other end of the first flexible part 140 connected to the first fixed part 120 is formed to be closer to the rotation axis (the Y axis) of the mass body 110 as compared with one end of the first flexible part 140 connected to the mass body 110, the tension gradually increases according to a rotation angle of the mass body 110 as represented by a line B. That is, in the MEMS device 100 according to the present embodiment, when the mass body 110 is rotated, the tension acting on the first flexible part 140 does not rapidly increase. Therefore, since rigidity of the first flexible part 140 does not rapidly increase either, limitation of driving displacement or sensing displacement of the mass body 110 may be prevented. In addition, since the tension of the first flexible part 140 is not rapidly changed, an increase in noise due to a rapid change in a resonance frequency may be prevented. Meanwhile, the first flexible parts 140 may be provided in pair at both sides of the mass body 110, respectively, and have one end connected to the protrusion part 113 of the mass body 110.

The second flexible part 150 serves to connect the mass body 110 and the second fixed part 125 to each other so that the mass body 110 may be displaced based on the second fixed part 125. Here, the second flexible part 150 is formed to be perpendicular to the first flexible part 140. That is, the second flexible part 150 is formed to correspond to the Y axis.

Figure 4:
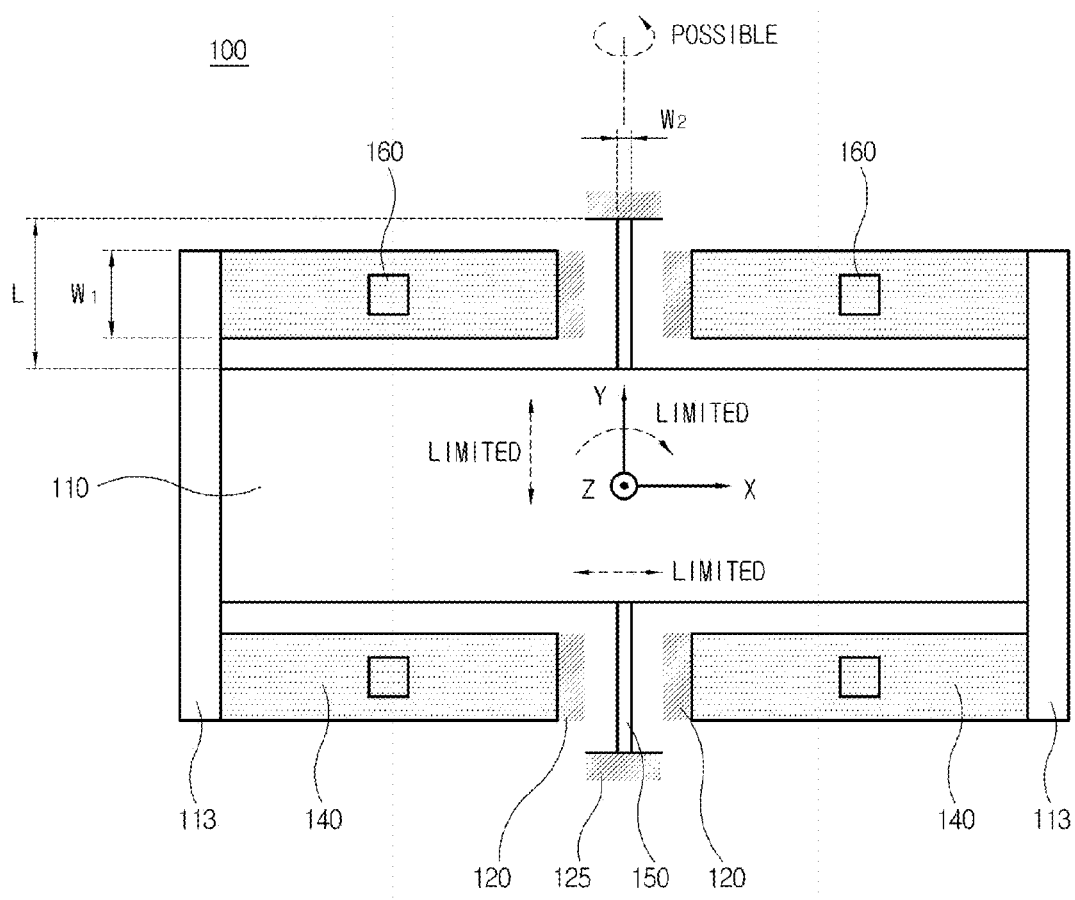
FIG. 4 is a plan view showing movable directions of a mass body shown in FIG. 1.

Meanwhile, FIG. 4 is a plan view showing movable directions of a mass body shown in FIGS. 1; and 5 is a side view showing movable directions of a mass body shown in FIG. 2. Hereinafter, the movable directions of the mass body 110 will be described with reference to FIGS. 4 and 5.

Figure 5:
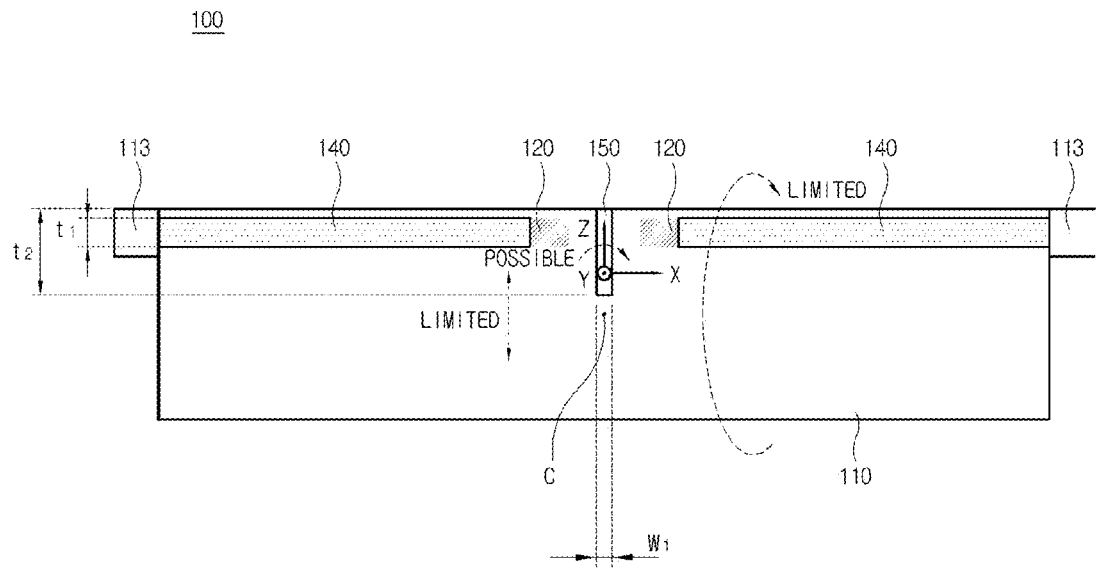
FIG. 5 is a side view showing movable directions of a mass body shown in FIG. 2.

Meanwhile, as shown in FIGS. 4 and 5, the first flexible part 140 may have a width $w_1$ in the Y axis direction larger than a thickness $t_1$ in the Z axis direction, and the second flexible part 150 may have a thickness $t_2$ in the Z axis direction larger than a width $w_2$ in the X axis direction. As described above, since the second flexible part 150 has the thickness $t_2$ in the Z axis direction larger than the width $w_2$ in the X axis direction, the mass body 110 is limited from being rotated based on the X axis or translated in the Z axis, but may be relatively freely rotated based on the Y axis. More specifically, in the case in which rigidity of the second flexible part 150 at the time of rotation based on the X axis is larger than rigidity of the second flexible part 150 at the time of rotation based on the Y axis, the mass body 110 may be freely rotated based on the Y axis, but is limited from being rotated based on the X axis. Similarly, in the case in which rigidity of the second flexible part 150 at the time of translation in the Z axis direction is larger than the rigidity of the second flexible part 150 at the time of the rotation based on the Y axis, the mass body 110 may be freely rotated based on the Y axis, but is limited from being translated in the Z axis direction. Therefore, as a value of (the rigidity of the second flexible part 150 at the time of the rotation based on the X axis or the rigidity of the second flexible part 150 at the time of the translation in the Z axis direction)/(the rigidity of the second flexible part 150 at the time of the rotation based on the Y axis) increases, the mass body 110 may be freely rotated based on the Y axis, but is limited from being rotated based on the X axis or translated in the Z axis direction.

Relationships among the thickness $t_2$ of the second flexible part 150 in the Z axis direction, a length L thereof in the Y axis direction, the width $w_2$ thereof in the X axis direction, and the rigidities thereof in each direction may be represented by the following Equations.

(1) The rigidity of the second flexible part 150 at the time of the rotation based on the X axis or the rigidity thereof at the time of the translation in the Z axis direction $\propto w_2 \times t_2^3 / L^3$ (2) The rigidity of the second flexible part 150 at the time of the rotation based on the Y axis $\propto w_2^3 \times t_2 / L$ According to the above two Equations, the value of (the rigidity of the second flexible part 150 at the time of the rotation based on the X axis or the rigidity of the second flexible part 150 at the time of the translation in the Z axis direction)/(the rigidity of the second flexible part 150 at the time of the rotation based on the Y axis) is in proportion to $(t_2/(w_2 L))^2$. However, since the second flexible part 150 according to the present embodiment has the thickness $t_2$ in the Z axis direction larger than the width $w_2$ in the X axis direction, $(t_2/(w_2 L))^2$ is large, such that the value of (the rigidity of the second flexible part 150 at the time of the rotation based on the X axis or the rigidity of the second flexible part 150 at the time of the translation in the Z axis direction)/(the rigidity of the second flexible part 150 at the time of the rotation based on the Y axis) increases. Due to these characteristics of the second flexible part 150, the mass body 110 is freely rotated based on the Y axis, but is limited from being rotated based on the X axis or translated in the Z axis direction (See FIG. 5).

Meanwhile, the first flexible part 140 has relatively very high rigidity in the length direction (the X axis direction), thereby making it possible to limit the mass body 110 from being rotated based on the Z axis or translated in the X axis direction (See FIG. 4). In addition, the second flexible part 150 has relatively very high rigidity in the length direction (the Y axis direction), thereby making it possible to limit the mass body 110 from being translated in the Y axis direction (See FIG. 4).

As a result, due to the characteristics of the first and second flexible parts 140 and 150 described above, the mass body 110 may be rotated based on the Y axis, but is limited from being rotated based on the X or Z axis or translated in the Z, Y, or X axis direction. That is, the movable directions of the mass body 110 may be represented by the following Table 1.

TABLE 1

| Movable direction of mass body | Whether or not movement is possible |
| --- | --- |
| Rotation based on X axis | Limited |
| Rotation based on Y axis | Possible |
| Rotation based on Z axis | Limited |
| Translation in X axis direction | Limited |
| Translation in Y axis direction | Limited |
| Translation in Z axis direction | Limited |

As described above, since the mass body 110 may be rotated based on the Y axis, but is limited from being moved in remaining directions, the displacement of the mass body 110 may be generated only with respect to force in a desired direction (rotation based on the Y axis). As a result, in the MEMS device 100 according to the present embodiment, generation of crosstalk at the time of measuring acceleration or force may be prevented, and interference of a resonance mode at the time of measuring angular velocity may be removed.

Figure 6A:
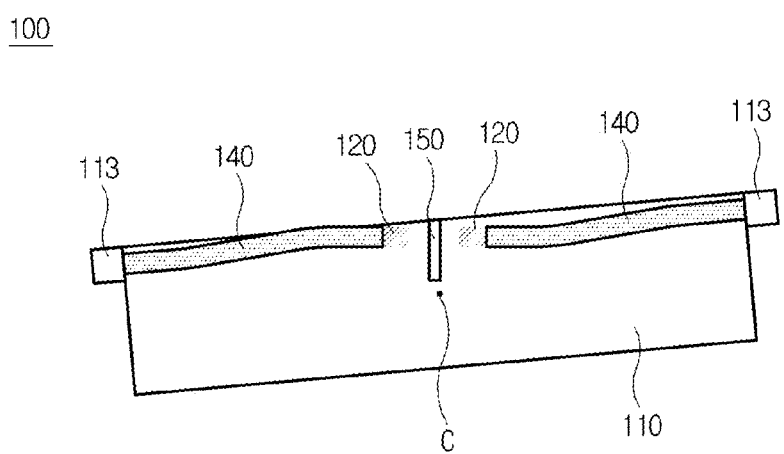
FIGS. 6A and 6B are side views showing a process in which the mass body shown in FIG. 2 is rotated based on a Y axis.
Figure 6B:
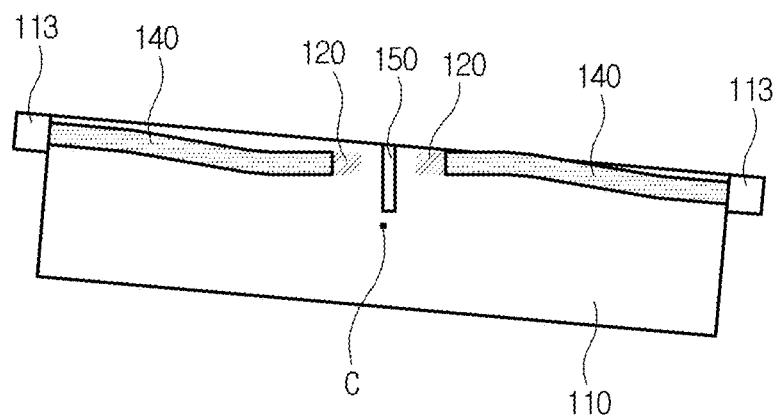

Meanwhile, FIGS. 6A and 6B are side views showing a process in which the mass body shown in FIG. 2 is rotated based on a Y axis. As shown in FIGS. 6A and 6B, since the mass body 110 is rotated based on the Y axis, bending stress in which compression stress and tension stress are combined with each other is generated in the first flexible part 140, and twisting stress is generated based on the Y axis in the second flexible part 150. In this case, in order to generate a torque in the mass body 110, the second flexible part 150 may be disposed over the center C of gravity of the mass body 110 based on the Z axis direction.

However, since the second flexible part 150, which is to limit the movable directions of the mass body 110, is not an indispensable component of the MEMS device 100 according to the present embodiment, it may also be omitted as needed.

Additionally, when viewed based on an XY plane (See FIG. 1), the first flexible part 140 is relatively wide, but the second flexible part 150 is relatively narrow. Therefore, the first flexible part 140 may be provided with a sensing unit 160 sensing the displacement of the mass body 110, or the like. Here, the sensing unit 160 may sense the displacement of the mass body 110 rotated based on the Y axis. In addition, the sensing unit 160 may be formed in a piezoelectric scheme, a piezoresistive scheme, a capacitive scheme, an optical scheme, or the like, but is not particularly limited thereto. However, the first flexible part 140 is not necessarily provided with the sensing unit 160, but may also be provided with a driving unit generating the displacement of the mass body 110. In this case, the driving unit may be formed in a piezoelectric scheme, a capacitive scheme, or the like.

Figure 7:
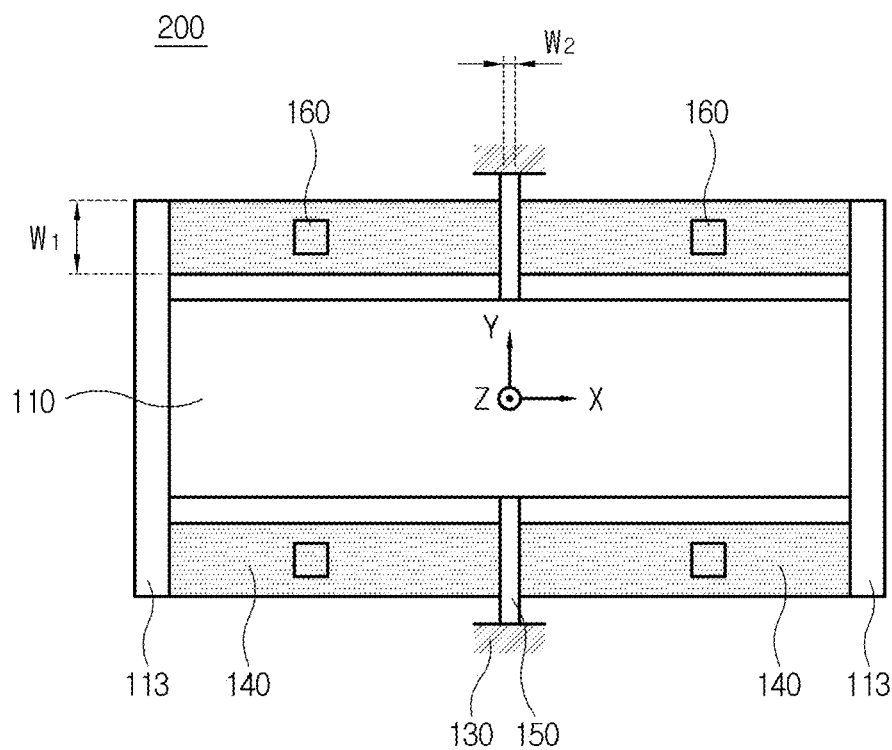
FIG. 7 is a plan view of an MEMS device according to a second preferred embodiment of the present invention.
Figure 8:
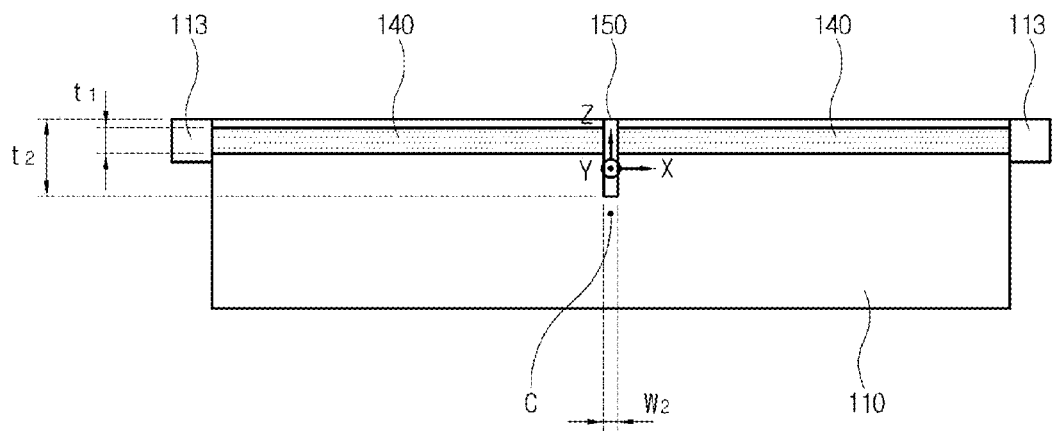
FIG. 8 is a side view of the MEMS device shown in FIG. 7.

FIG. 7 is a plan view of an MEMS device according to a second preferred embodiment of the present invention; and FIG. 8 is a side view of the MEMS device shown in FIG. 7.

As shown in FIGS. 7 and 8, the MEMS device 200 according to the present embodiment is configured to include a mass body 110 rotated based on a Y axis, a fixed part 130 provided at an outer side of the mass body 110, a second flexible part 150 having one end connected to the mass body 110 and the other end connected to the fixed part 130 so as to corresponding the Y axis, and a first flexible part 140 having one end connected to a distal end of the mass body 110 in an X axis direction and the other connected fixed to the second flexible part 150, so as to correspond to the X axis direction, the other end being closer to the Y axis as compared with one end.

The MEMS device 200 according to the present embodiment is different from the MEMS device 100 according to the first preferred embodiment of the present invention described above in that the other end of the first flexible part 140 is connected to the second flexible part 150. Therefore, a description of contents of the MEMS device 200 according to the present embodiment overlapped with those of the MEMS device 100 according to the first preferred embodiment of the present invention will be omitted, and the above-mentioned difference therebetween will be mainly described.

The mass body 110, which is displaced by inertial force, Coriolis force, external force, driving force, or the like, is connected to the fixed part 130 through the second flexible part 150 and is connected to the second flexible part 150 through the first flexible part 140. In addition, the mass body 110 may include a protrusion part 113 protruded in the Y axis direction at a distal end thereof in the X axis direction. One end of the first flexible part 140 may be connected to the protrusion part 113.

The fixed part 130 serves to support the second flexible part 150 to allow a space in which the mass body 110 may be displaced to be secured and become a basis when the mass body 110 is displaced. Here, a position of the fixed part 130 is not particularly limited as long as the fixed part 130 is provided at the outer side of the mass body 110. However, since the second flexible part 150 is formed to correspond to the Y axis so that the mass body 110 is rotated based on the Y axis, the fixed part 130 to which the second flexible part 150 is connected may also be provided on the Y axis.

The first flexible part 140 serves to connect the mass body 110 and the second flexible part 150 to each other so that the mass body 110 may be displaced based on the fixed part 130. Here, the first flexible part 140 is formed to be extended in the X axis direction and has one end connected to the distal end of the mass body 110 in the X axis direction and the other end connected to the second flexible part 150. Therefore, the other end of the first flexible part 140 connected to the second flexible part 150 is closer to a rotation axis (the Y axis) of the mass body 110 as compared with one end of the first flexible part 140 connected to the mass body 110. That is, a fixed portion of the first flexible part 140 (the other end of the first flexible part 140) is close to the rotation axis (the Y axis) of the mass body 110. Particularly, since the second flexible part 150 is formed to correspond to the rotation axis (the Y axis) of the mass body 110, the other end of the first flexible part 140 connected to the second flexible part 150 almost coincides with the rotation axis (the Y axis) of the mass body 110. Therefore, even though the mass body 110 is rotated based on the Y axis, a length of the first flexible part 140 is hardly changed. As described above, when the mass body 110 is rotated, if the change in the length of the first flexible part 140 itself is minimized, tension acting on the first flexible part 140 does not rapidly increase. Therefore, since rigidity of the first flexible part 140 does not rapidly increase either, limitation of driving displacement or sensing displacement of the mass body 110 may be prevented. In addition, since the tension of the first flexible part 140 is not rapidly changed, an increase in noise due to a rapid change in a resonance frequency may be prevented. Meanwhile, the first flexible parts 140 may be provided in pair at both sides of the mass body 110, respectively, and have one end connected to the protrusion part 113 of the mass body 110.

The second flexible part 150 serves to connect the mass body 110 and the fixed part 130 to each other so that the mass body 110 may be displaced based on the fixed part 130. Here, the second flexible part 150 is formed to be perpendicular to the first flexible part 140. That is, the second flexible part 150 is formed to correspond to the Y axis. As shown in FIGS. 7 and 8, the first flexible part 140 may have a width $w_1$ in the Y axis direction larger than a thickness $t_1$ in the Z axis direction, and the second flexible part 150 may have a thickness $t_2$ in the Z axis direction larger than a width $w_2$ in the X axis direction. Due to the characteristics of the first and second flexible parts 140 and 150 described above, similar to the MEMS device 100 according to the first preferred embodiment of the present invention described above, the mass body 110 may be rotated based on the Y axis, but is limited from being rotated based on the X or Z axis or translated in the Z, Y, or X axis direction.

Figure 9:
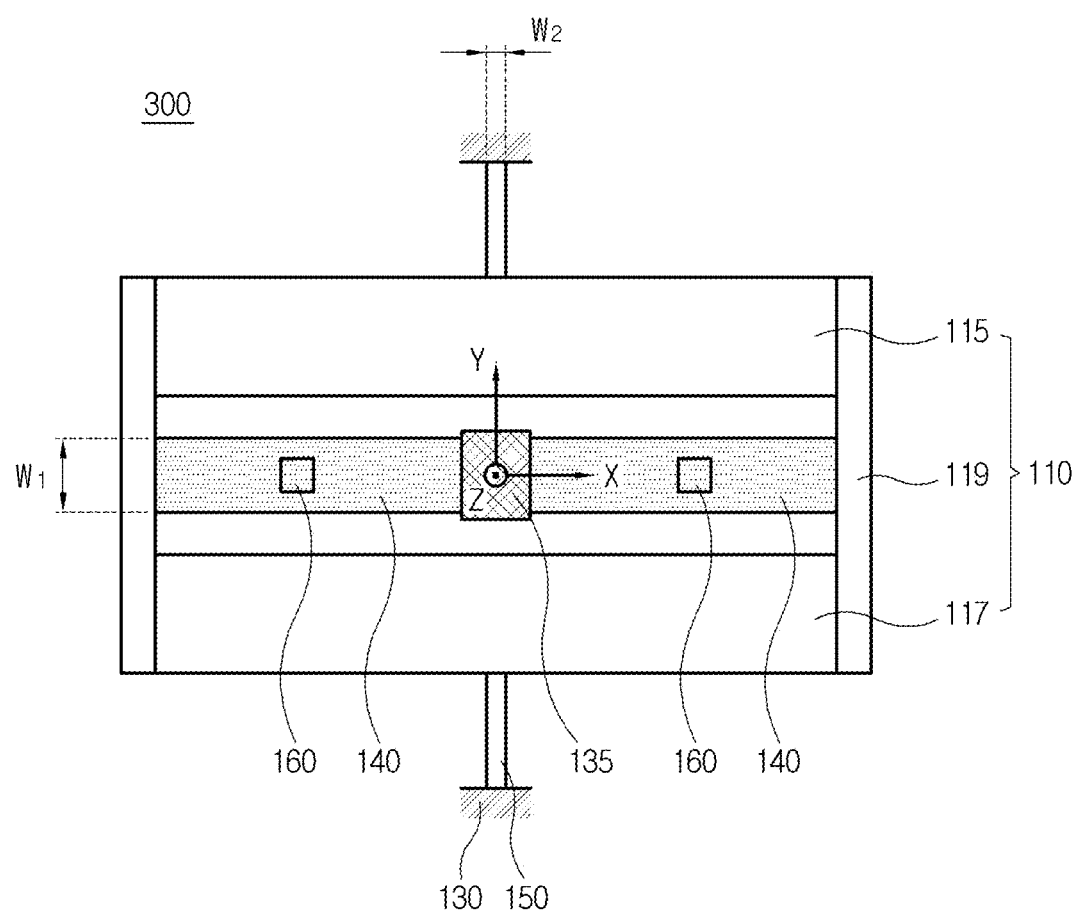
FIG. 9 is a plan view of an MEMS device according to a third preferred embodiment of the present invention.
Figure 10:
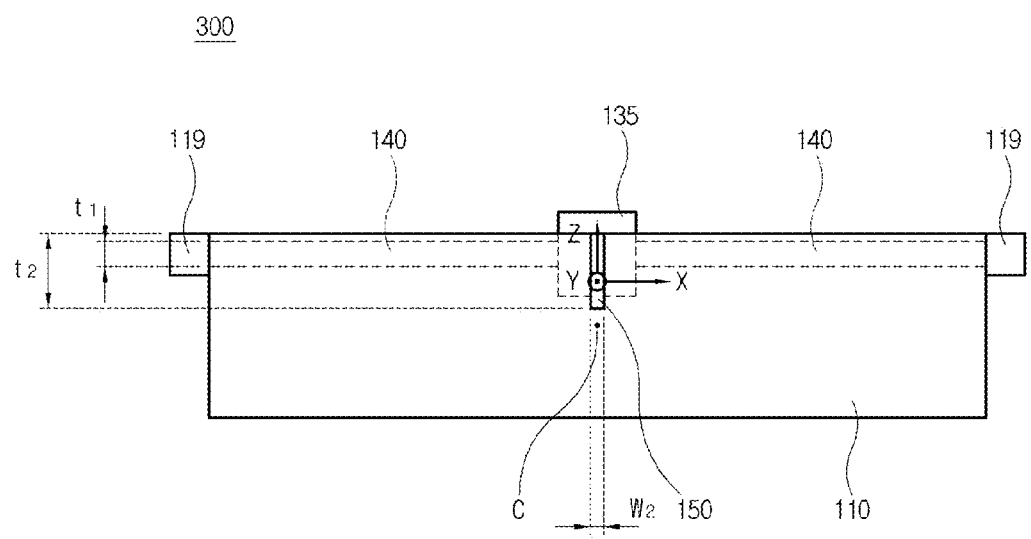
FIG. 10 is a side view of the MEMS device shown in FIG. 9.
Figure 11:
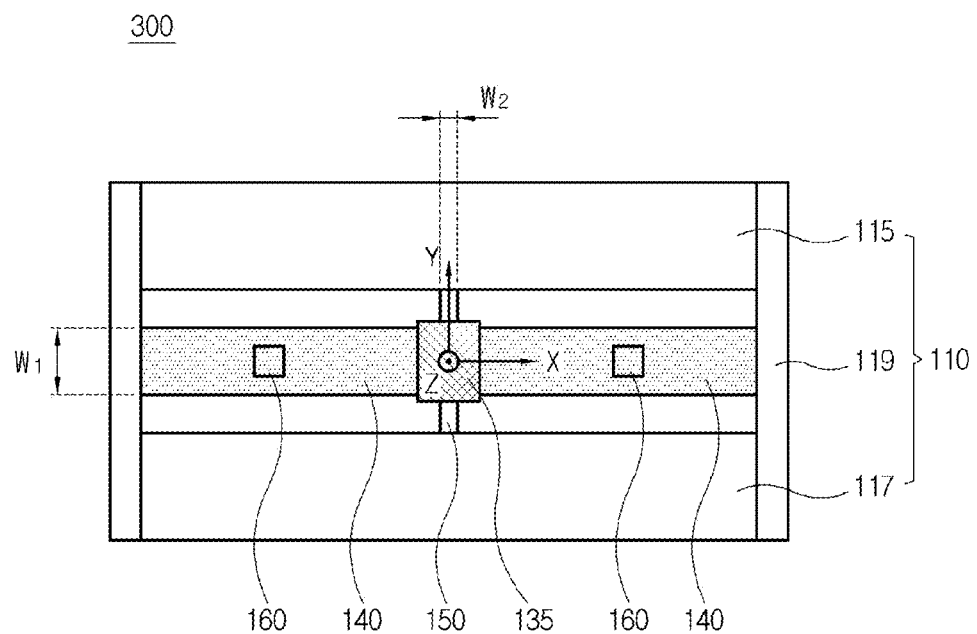
FIG. 11 is a plan view of an MEMS device according to a modified example of the third preferred embodiment of the present invention.
Figure 12:
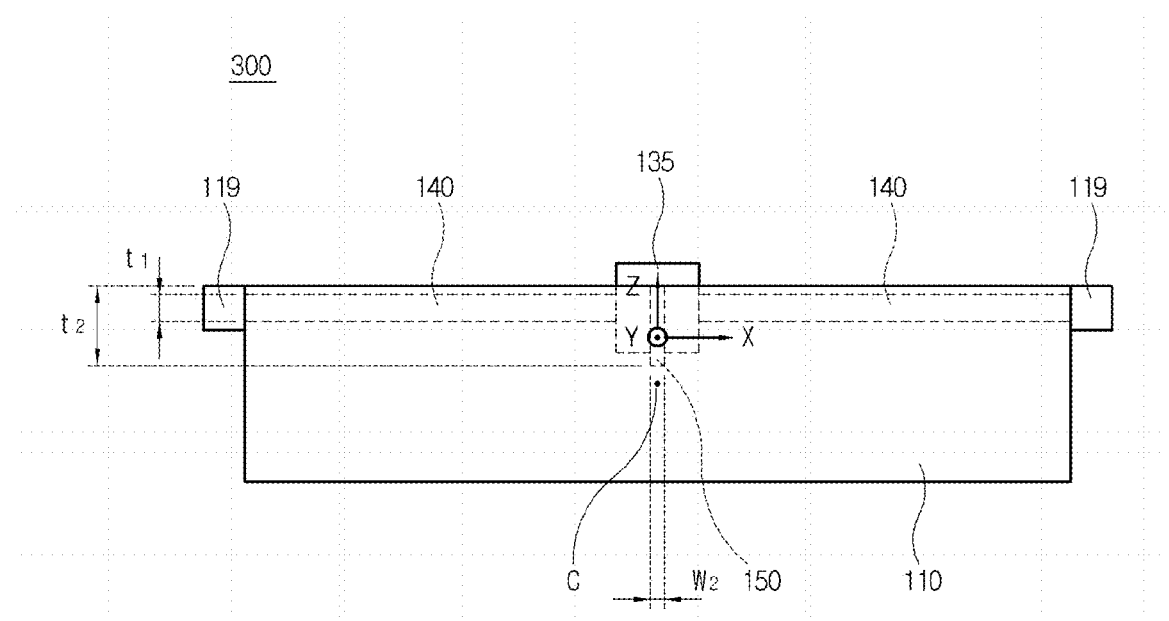
FIG. 12 is a side view of the MEMS device shown in FIG. 11.

FIG. 9 is a plan view of an MEMS device according to a third preferred embodiment of the present invention; FIG. 10 is a side view of the MEMS device shown in FIG. 9; FIG. 11 is a plan view of an MEMS device according to a modified example of the third preferred embodiment of the present invention; and FIG. 12 is a side view of the MEMS device shown in FIG. 11.

As shown in FIGS. 9 to 12, the MEMS device 300 according to the present embodiment is configured to include a mass body 110 rotated based on a Y axis, an anchor 135 provided to be surrounded by the mass body 110, and a first flexible part 140 having one end connected to a distal end of the mass body 110 in an X axis direction and the other end connected to the anchor 135, so as to correspond to the X axis direction, the other end being closer to the Y axis as compared with one end.

The MEMS device 300 according to the present embodiment is different from the MEMS device 100 according to the first preferred embodiment of the present invention described above in that it includes the anchor 135. Therefore, a description of contents of the MEMS device 300 according to the present embodiment overlapped with those of the MEMS device 100 according to the first preferred embodiment of the present invention will be omitted, and the above-mentioned difference therebetween will be mainly described.

The mass body 110, which is displaced by inertial force, Coriolis force, external force, driving force, or the like, is connected to the anchor 135 through the first flexible part 140 and is connected to the fixed part 130 (See FIG. 9) or the anchor 135 (See FIG. 11) through the second flexible part 150. In addition, the mass body 110 may include a first mass body 115 and a second mass body 117 that are spaced apart from each other. Here, the first and second mass bodies 115 and 117 may be disposed in parallel with each other in the X axis direction. In addition, a distal end of the first mass body 115 in the X axis direction and a distal end of the second mass body 117 in the X axial direction may be provided with a connection part 119 connecting therebetween in a Y axis direction. One end of the first flexible part 140 may be connected to the connection part 119.

The anchor 135 serves to support the first flexible part 140 so that the mass body 110 may be displaced and become a basis when the mass body 110 is displaced. Here, a position of the anchor 135 is not particularly limited as long as the anchor 135 is provided to be surrounded by the mass body 110. For example, the anchor 135 may be provided between the first and second mass bodies 115 and 117.

Meanwhile, as shown in FIG. 9, the MEMS device 300 according to the present embodiment may include the fixed part 130 apart from the anchor 135. Here, the fixed part 130 serves to support the second flexible part 150 to allow a space in which the mass body 110 may be displaced to be secured and become a basis when the mass body 110 is displaced. Here, the second flexible part 150 connects the mass body 110 and the fixed part 130 to each other. Meanwhile, a position of the fixed part 130 is not particularly limited as long as the fixed part 130 is provided at the outer side of the mass body 110. However, since the second flexible part 150 is formed to correspond to the Y axis so that the mass body 110 is rotated based on the Y axis, the fixed part 130 to which the second flexible part 150 is connected may also be provided on the Y axis. Meanwhile, the fixed part 130 is not a necessarily necessary component. For example, as shown in FIGS. 11 and 12, in the case in which the second flexible part 150 is connected to the anchor 135, the fixed part 130 may also be omitted.

The first flexible part 140 serves to connect the mass body 110 and the anchor 135 to each other so that the mass body 110 may be displaced based on the anchor 135. Here, the first flexible part 140 is formed to be extended in the X axis direction and has one end connected to the distal end of the mass body 110 in the X axis direction and the other end connected to the anchor 135. Here, the other end of the first flexible part 140 connected to the anchor 135 is closer to a rotation axis (the Y axis) of the mass body 110 as compared with one end of the first flexible part 140 connected to the mass body 110. That is, a fixed portion of the first flexible part 140 (the other end of the first flexible part 140) is close to the rotation axis (the Y axis) of the mass body 110. In the case in which the fixed portion of the first flexible part 140 (the other end of the first flexible part 140) completely coincides with the rotation axis (the Y axis) of the mass body 110, even though the mass body 110 is rotated, a length of the first flexible part 140 itself is not changed. Therefore, in the case in which the fixed portion of the first flexible part 140 (the other end of the first flexible part 140) is formed to be close to the rotation axis (the Y axis) of the mass body 110 as in the MEMS device 300 according to the present embodiment, when the mass body 110 is rotated, the change in the length of the first flexible part 140 itself may be minimized. As described above, when the mass body 110 is rotated, if the change in the length of the first flexible part 140 itself is minimized, tension acting on the first flexible part 140 does not rapidly increase. Therefore, since rigidity of the first flexible part 140 does not rapidly increase either, limitation of driving displacement or sensing displacement of the mass body 110 may be prevented. In addition, since the tension of the first flexible part 140 is not rapidly changed, an increase in noise due to a rapid change in a resonance frequency may be prevented. Meanwhile, the first flexible part 140 may be provided at both sides of the anchor 135, respectively, and have one end connected to the connection part 119 of the mass body 110.

The second flexible part 150 serves to connect the mass body 110 and the fixed part 130 (See FIG. 9) to each other or connect the mass body 110 and the anchor 135 (See FIG. 11)

to each other so that the mass body 110 may be changed based on the anchor 135 or the fixed part 130. Here, the second flexible part 150 is formed to be perpendicular to the first flexible part 140. That is, the second flexible part 150 is formed to correspond to the Y axis. As shown in FIGS. 9 to 12, the first flexible part 140 may have a width $w_1$ in the Y axis direction larger than a thickness $t_1$ in the Z axis direction, and the second flexible part 150 may have a thickness $t_2$ in the Z axis direction larger than a width $w_2$ in the X axis direction. Due to the characteristics of the first and second flexible parts 140 and 150 described above, similar to the MEMS device 100 according to the first preferred embodiment of the present invention described above, the mass body 110 may be rotated based on the Y axis, but is limited from being rotated based on the X or Z axis or translated in the Z, Y, or X axis direction. However, since the second flexible part 150, which is to limit the movable directions of the mass body 110, is not an indispensable component of the MEMS device 300 according to the present embodiment, it may also be omitted as needed.

Meanwhile, the MEMS device according to the preferred embodiments of the present invention may be used in various fields. For example, the MEMS device according to the preferred embodiments of the present invention may be used in an angular velocity sensor, an acceleration sensor, an actuator, or the like.

According to the preferred embodiments of the present invention, the distal end of the flexible part connected to the fixed part is disposed to be close to the rotation axis of the mass body, such that when the mass body is rotated, the tension acting on the flexible part does not rapidly increase. Therefore, the rigidity of the flexible part does not rapidly increase either, thereby making it possible to prevent the driving displacement or the sensing displacement of the mass body from being limited.

In addition, according to the preferred embodiments of the present invention, the distal end of the flexible part connected to the fixed part is disposed to be close to the rotation axis of the mass body, such that when the mass body is rotated, the tension acting on the flexible part is not rapidly changed. Therefore, the rigidity of the flexible part is not rapidly changed either. As a result, an increase in noise due to a change in a resonance frequency may be prevented.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A micro electro mechanical systems (MEMS) device comprising:
   a mass body;
   a first fixed part provided at an outer side of the mass body; and
   a first flexible part having one end connected to a distal end of the mass body and the other end connected to the first fixed part,
   wherein the mass body is rotatably connected to the first flexible part, and the other end of the first flexible part connected to the first fixed part is formed to extend toward a rotation axis of the mass body.

2. The MEMS device as set forth in claim 1, wherein the mass body rotated based on a Y axis, and the first flexible part having one end connected to a distal end of the mass body in an X axis direction and the other end connected to the first fixed part, so as to correspond to the X axis direction, the other end being closer to the Y axis as compared with one end.

3. The MEMS device as set forth in claim 2, further comprising:
   a second fixed part provided at an outer side of the mass body; and
   a second flexible part having one end connected to the mass body and the other end connected to the second fixed part, so as to correspond to the Y axis.

4. The MEMS device as set forth in claim 3, wherein the first flexible part has a width in a Y axis direction larger than a thickness in a Z axis direction, and the second flexible part has a thickness in the Z axis direction larger than a width in the X axis direction.

5. The MEMS device as set forth in claim 1, further comprising a protrusion part protruded in a Y axis direction at a distal end of the mass body in the X axis direction, wherein one end of the first flexible part is connected to the protrusion part.

6. An MEMS device comprising:
   a mass body;
   a fixed part provided at an outer side of the mass body;
   a second flexible part having one end connected to the mass body and the other end connected to the fixed part; and
   a first flexible part having one end connected to a distal end of the mass body and the other end connected to the second flexible part,
   wherein the mass body is rotatably connected to the second flexible part.

7. The MEMS device as set forth in claim 6, wherein the mass body rotated based on a Y axis, the second flexible part having one end connected to the mass body and the other end connected to the fixed part so as to corresponding the Y axis, and the first flexible part having one end connected to a distal end of the mass body in an X axis direction and the other end connected to the second flexible part, so as to correspond to the X axis direction, the other end being closer to the Y axis as compared with one end.

8. The MEMS device as set forth in claim 6, wherein the first flexible part has a width in a Y axis direction larger than a thickness in a Z axis direction, and the second flexible part has a thickness in the Z axis direction larger than a width in the X axis direction.

9. The MEMS device as set forth in claim 6, further comprising a protrusion part protruded in a Y axis direction at a distal end of the mass body in the X axis direction, wherein one end of the first flexible part is connected to the protrusion part.

10. An MEMS device comprising:
    a mass body;
    an anchor provided to be surrounded by the mass body; and
    a first flexible part having one end connected to a distal end of the mass body and the other end connected to the anchor,
    wherein the mass body is rotatably connected to the first flexible part.

11. The MEMS device as set forth in claim 10, wherein the mass body rotated based on a Y axis, the first flexible part having one end connected to a distal end of the mass body in an X axis direction and the other end connected to the anchor, so as to correspond to the X axis direction, the other end being closer to the Y axis as compared with one end.

12. The MEMS device as set forth in claim 10, further comprising: a fixed part provided at an outer side of the mass body; and a second flexible part having one end connected to the mass body and the other end connected to the fixed part, so as to correspond to the Y axis.

13. The MEMS device as set forth in claim 10, wherein the first flexible part has a width in a Y axis direction larger than a thickness in a Z axis direction, and the second flexible part has a thickness in the Z axis direction larger than a width in the X axis direction.

14. The MEMS device as set forth in claim 10, further comprising a second flexible part having one end connected to the mass body and the other end connected to the anchor, so as to correspond to the Y axis.

15. The MEMS device as set forth in claim 10, wherein the mass body includes a first mass body and a second mass body that are spaced apart from each other, and the anchor is provided between the first and second mass bodies.

16. The MEMS device as set forth in claim 14, wherein the first flexible part has a width in a Y axis direction larger than a thickness in a Z axis direction, and the second flexible part has a thickness in the Z axis direction larger than a width in the X axis direction.

17. The MEMS device as set forth in claim 15, further comprising a connection part formed to connect between a distal end of the first mass body in the X axis direction and a distal end of the second mass body in the X axis direction in a Y axis direction, wherein one end of the first flexible part is connected to the connection part.

\* \* \* \* \*